(12) United States Patent
Wang et al.

(10) Patent No.: US 8,129,280 B2
(45) Date of Patent: Mar. 6, 2012

(54) SUBSTRATE DEVICE HAVING A TUNED WORK FUNCTION AND METHODS OF FORMING THEREOF

(75) Inventors: Rongjun Wang, Dublin, CA (US);
Xianmin Tang, San Jose, CA (US);
Dengliang Yang, Fremont, CA (US);
Zhendong Liu, San Jose, CA (US);
Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 126 days.

(21) Appl. No.: 12/508,820

(22) Filed: Jul. 24, 2009

(65) Prior Publication Data
US 2011/0018073 A1 Jan. 27, 2011

(51) Int. Cl.
*H01L 21/311* (2006.01)
(52) U.S. Cl. ........................................... 438/694
(58) Field of Classification Search .............. 438/591, 438/592, 401, 627, 3, 396, 683, 694
See application file for complete search history.

(56) References Cited

U.S. PATENT DOCUMENTS

| | | |
|---|---|---|
| 6,506,676 B2 | 1/2003 | Park et al. |
| 6,893,924 B2 | 5/2005 | Visokay |
| 7,397,090 B2 | 7/2008 | Mathew et al. |
| 2001/0034106 A1* | 10/2001 | Moise et al. .............. 438/396 |
| 2007/0018244 A1 | 1/2007 | Hung et al. |

OTHER PUBLICATIONS

J. Robertson, "High dielectric constant oxides", 2004, Eur. Phys. J. Appl. Phys. vol. 28, pp. 265-291, Table 2.*
Quirk et al., "Semiconductor Manufacturing Technology", 2001, Prentice-Hall., pp. 316-319, Fig. 12.19).*
SiliconFarEast webpage at http://www.siliconfareast.com/sputtering.htm.*
Li, Tzung-Lin et al., "Continuous and Precise Work Function Adjustment for Integratable Dual Metal Gate CMOS Technology Using Hf-Mo Binary Alloys," IEEE Transactions on Electron Devices, vol. 52, No. 6, Jun. 2005, pp. 1172-1179.

* cited by examiner

*Primary Examiner* — Thomas L Dickey
*Assistant Examiner* — Nikolay Yushin
(74) *Attorney, Agent, or Firm* — Alan Taboada; Moser Taboada (57) ABSTRACT

Substrate devices having tuned work functions and methods of forming thereof are provided. In some embodiments, forming devices on substrates may include depositing a dielectric layer atop a substrate having a conductivity well; depositing a work function layer comprising titanium aluminum or titanium aluminum nitride having a first nitrogen composition atop the dielectric layer; etching the work function layer to selectively remove at least a portion of the work function layer from atop the dielectric layer; depositing a layer comprising titanium aluminum or titanium aluminum nitride having a second nitrogen composition atop the work function layer and the substrate, wherein at least one of the work function layer or the layer comprises nitrogen; etching the layer and the dielectric layer to selectively remove a portion of the layer and the dielectric layer from atop the substrate; and annealing the substrate at a temperature less than about 1500 degrees Celsius.

17 Claims, 9 Drawing Sheets

SUBSTRATE DEVICE HAVING A TUNED WORK FUNCTION AND METHODS OF FORMING THEREOF

BACKGROUND

1. Field

Embodiments of the present invention generally relate to the field of semiconductor manufacturing processes and devices.

2. Description of the Related Art

Integrated circuits may include more than one million micro-electronic field effect transistors or devices (e.g., complementary metal-oxide-semiconductor (CMOS) field effect transistors) that are formed on a substrate and cooperate to perform various functions within the circuit. A CMOS transistor comprises a gate structure disposed over a channel region formed between source and drain regions of the transistor. The gate structure generally comprises a gate electrode and a gate dielectric. The gate electrode is disposed over the gate dielectric and, in operation, is used to control a flow of charge carriers (i.e., electric current) in the channel region beneath the gate dielectric.

In conventional device formation, polysilicon layers are used as gate electrodes. However, the polysilicon layers must be doped in order to achieve a desired work function. Unfortunately, polysilicon gate electrodes suffer from a depletion effect. The depletion effect occurs when the portion of the gate electrode nearest an underlying oxide layer is depleted of dopants, causing the gate electrode layer to behave like an insulating layer, leading to device degradation and eventual malfunction. For high performance CMOS applications where high-k layers are applied, the polysilicon gate interacts with the high-k film, resulting high threshold voltage and poor transistor drive performance.

To overcome these deficiencies, metal gate electrodes may be used in place of polysilicon gate electrodes. However, conventional materials used in metal gate electrodes typically have a limited work function tuning range, making the selection of material limited for each individual need.

Therefore, there is a need in the art for improved methods for forming a gate electrode having a tunable work function.

SUMMARY

Substrate devices having a tunable work function and methods of forming thereof are provided herein. In some embodiments a method of forming a device on a substrate may include depositing a dielectric layer atop a substrate having a conductivity well; depositing a work function layer comprising titanium aluminum or titanium aluminum nitride having a first nitrogen composition atop the dielectric layer; etching the work function layer to selectively remove at least a portion of the work function layer from atop the dielectric layer; depositing a layer comprising titanium aluminum or titanium aluminum nitride having a second nitrogen composition atop the work function layer and the substrate, wherein at least one of the work function layer or the layer comprises nitrogen; etching the layer and the dielectric layer to selectively remove a portion of the layer and the dielectric layer from atop the substrate; and annealing the substrate at a temperature less than about 1500 degrees Celsius.

In some embodiments, a method of forming a device on a substrate may include providing a substrate comprising a conductivity well and an oxide layer formed thereon, wherein the oxide layer comprises at least one feature formed therein defining at least one polycrystalline gate device formed atop the conductivity well and wherein the polycrystalline gate device comprises a first layer of dielectric material disposed atop the conductivity well, a second layer comprising tantalum nitride (TaN) or titanium nitride (TiN) disposed atop the dielectric material and a polycrystalline material disposed atop the second layer; etching the polycrystalline material to expose the upper surface of the second layer; depositing a work function layer atop the second layer, wherein the work function layer comprises titanium aluminum or titanium aluminum nitride; filling the feature with a conductive material; annealing the substrate to form the device.

In some embodiments, a gate electrode having a tuned work function may include a dielectric layer disposed atop a substrate having a conductivity well; a work function layer disposed atop the dielectric layer, wherein the work function layer has a work function metal comprising titanium aluminum or titanium aluminum nitrogen having a first composition of nitrogen; and a layer disposed atop the work function layer and comprising titanium aluminum or titanium aluminum nitrogen having a second composition of nitrogen, wherein at least one of the work function layer or the layer comprises nitrogen.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only exemplary embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to semiconductor devices and methods for processing substrates. The inventive methods include methods for forming a device having a tunable work function. The inventive methods may advantageously provide a gate electrode that is not susceptible to dopant depletion and may provide a wide tunable work function range, thereby reducing device degradation and increasing reliability.

Figure 5:
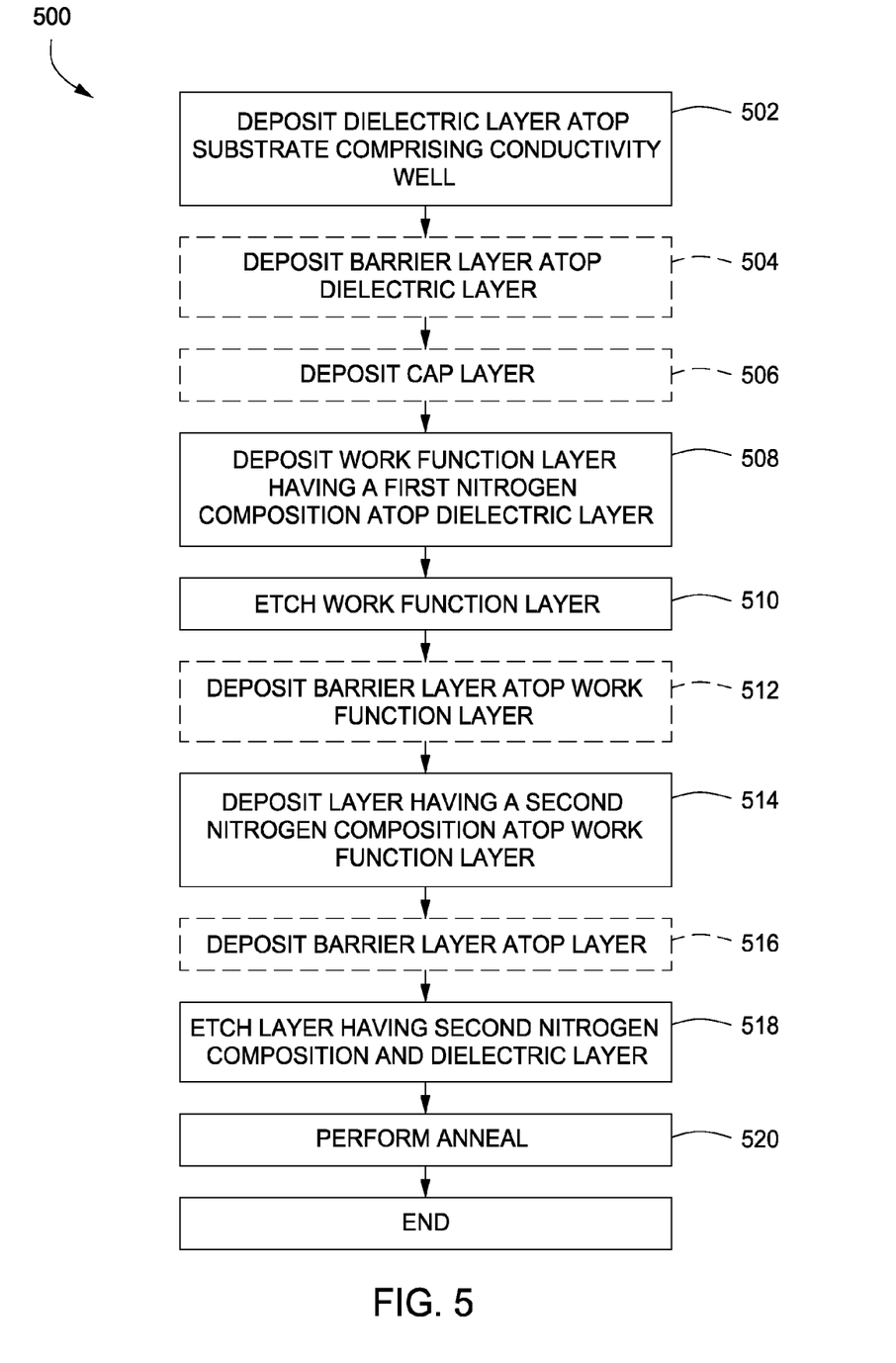
FIG. 5 depicts a method for processing substrates in accordance with some embodiments of the invention.

FIG. 5 depicts a method for processing semiconductor substrates in accordance with some embodiments of the present invention. FIGS. 1A-F depict illustrative cross-sectional views of a substrate during different stages of the method of FIG. 5 with respect to forming a semiconductor device atop a p-type conductivity well, in accordance with some embodiments of the present invention. FIGS. 2A-D depict illustrative cross-sectional views of a substrate during different stages of the method of claim 5 with respect to forming a semiconductor device atop an n-type conductivity well, in accordance with some embodiments of the present invention. The above method may be performed in any apparatus suitable for processing semiconductor substrates in accordance with some embodiments of the present invention, such as discussed below with respect to FIG. 7.

Figure 1A:
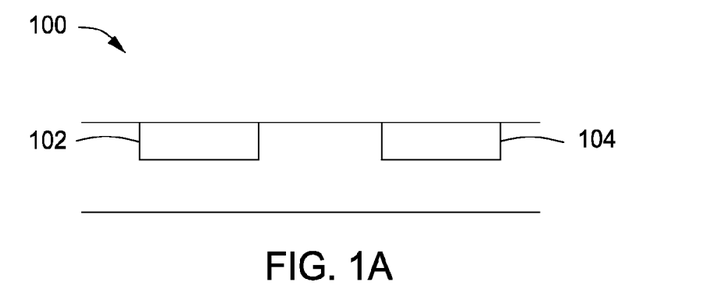
FIG. 1A is an illustrative cross-sectional view of a substrate during a stage of a processing sequence in accordance with some embodiments of the present invention.
Figure 1B:
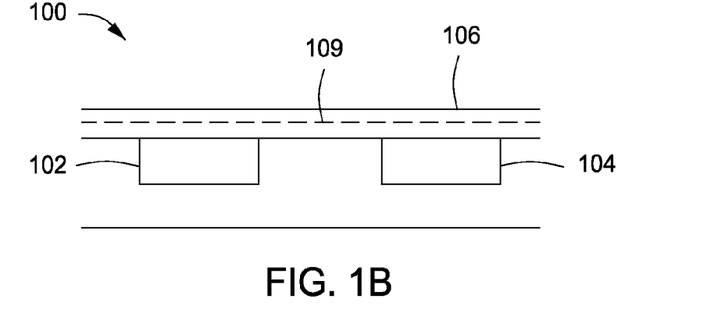
FIG. 1B is an illustrative cross-sectional view of a substrate during a stage of a processing sequence in accordance with some embodiments of the present invention.

The method 500 begins at 502, where a dielectric layer 106 is deposited atop a substrate 100 comprising one or more conductivity wells, as shown in FIG. 1B. The substrate 100 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 100 may be a semiconductor wafer (e.g., a 200 mm, 300 mm, or the like silicon wafer), such as a doped or undoped polysilicon wafer, a doped or undoped silicon wafer, a patterned or non-patterned wafer, or the like.

In some embodiments, as shown in FIG. 1A, the substrate 100 may include a plurality of conductivity wells defined therein, such as a p-type conductivity well (region) 102 or an n-type region conductivity well (region) 104. In some embodiments, such as where one or more devices are to be formed on the substrate 100, a plurality of field isolation regions (not shown) may be formed in the substrate 100 to isolate conductivity wells having different conductivity types (e.g., n-type or p-type) and/or to isolate adjacent transistors. The field isolation regions may be shallow trench isolation (STI) structures formed, for example, by etching a trench into the substrate 100 and then filling the trench with a suitable insulator, such as silicon oxide (oxide), silicon nitride (nitride), or the like.

In some embodiments, the dielectric layer 106 may comprise a dielectric material having a high dielectric constant (K), such as a material having a dielectric constant greater than about 3.9. For example, the high-K dielectric material may be hafnium oxide ($HfO_2$), hafnium silicon oxide ($HfSiO_x$), hafnium silicon oxynitride ($HfSiNO_x$), or the like. In some embodiments, the dielectric layer 106 may comprise more than one layer. For example, as shown in FIG. 1B, the dielectric layer 106 may comprise a first layer 109, comprising for example silicon oxide ($SiO_2$), and a second layer comprising a high-K dielectric material disposed atop the first layer. In such embodiments, the first layer 109 may have a thickness of up to about 10 Angstroms (Å) and the second layer comprising a high-K dielectric material may have a thickness of up to about 50 Angstroms. The dielectric layer 106 may be deposited by any suitable deposition process, for example, atomic layer deposition (ALD), chemical vapor deposition (CVD), physical vapor deposition (PVD), or the like.

Figure 1C:
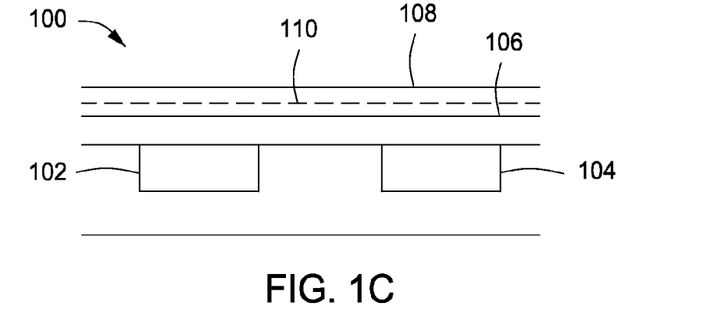
FIG. 1C is an illustrative cross-sectional view of a substrate during a stage of a processing sequence in accordance with some embodiments of the present invention.
Figure 2A:
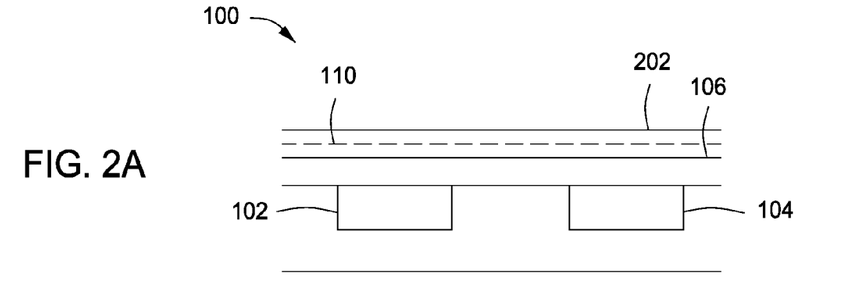
FIG. 2A is an illustrative cross-sectional view of a substrate during a stage of a processing sequence in accordance with some embodiments of the present invention.

In some embodiments, at 504, an optional barrier layer 110 may be deposited atop the dielectric layer 106 (as depicted in FIGS. 1C and 2A). In some embodiments, the barrier layer 110 may have a thickness of up to about 40 Å, or in some embodiments, a thickness of up to about 20 Å. In some embodiments, a thickness uniformity of the barrier layer 110 may have a standard of deviation of less than about 2%. The barrier layer 110 may be deposited via any deposition process capable of depositing the barrier layer 110 to the desired thickness while not producing process induced damage, such as ALD, CVD, PVD, or the like. In some embodiments, the barrier layer may comprise tantalum nitride (TaN) or titanium nitride (TiN). In some embodiments, a compositional uniformity of the barrier layer 110 may have a standard of deviation of less than about 2%.

In some embodiments, one or more optional cap layers (not shown) may be deposited at 506 prior to depositing the work function layer 108, 202 at 508. For example, in some embodiments, such as in embodiments where the dielectric layer 106 comprises more than one layer as described above, an optional cap layer may be deposited atop the first layer 109 prior to depositing the second layer comprising the high-K dielectric material. Alternatively or in combination, in some embodiments, an optional cap layer may be deposited atop the dielectric layer 106. In some embodiments, such as where the optional barrier layer 110 is deposited atop the dielectric layer 106, as described above, the optional cap layer may be deposited atop the dielectric layer 106 prior to depositing the optional barrier layer 110 or the optional cap layer may be deposited atop the optional barrier layer 110.

In some embodiments the one or more optional cap layers may have a thickness of up to about 20 Å, with a thickness uniformity standard of deviation of less than about 1%. In some embodiments, such as when the device is to be formed atop the p-type conductivity well 102, such as depicted in FIG. 1C, the cap layer may comprise lanthanum or lanthanum oxide and may have a compositional uniformity standard of deviation of less than about 1%. In embodiments where the cap layer comprises lanthanum, a layer of lanthanum may be deposited and subsequently oxidized by exposing the lanthanum to oxygen, water vapor, air, ozone, or the like. Alternatively, in some embodiments, such as where the device is formed atop the n-type conductivity well 104, such as depicted in FIG. 2A, the cap layer may comprise aluminum or aluminum oxide and have a compositional uniformity standard of deviation of less than about 1%. In embodiments where the cap layer comprises aluminum, a layer of aluminum may be deposited and subsequently oxidized by exposing the aluminum to oxygen, water vapor, air, ozone, or the like. The one or more cap layers may be deposited by any suitable deposition process, such as CVD, PVD, ALD, or the like.

Next at 508, the work function layer 108, 202 having a first nitrogen composition is deposited atop the dielectric layer 106, as shown in FIGS. 1C and 2A. In some embodiments, the work function layer may comprise a nitrided titanium alloy, such as nitrides of titanium aluminum (TiAlN), titanium lanthanum (TiLaN), titanium silicon (TiSiN), titanium hafnium (TiHfN), titanium ruthenium (TiRuN), titanium cobalt (TiCoN), or the like. In such embodiments, the ratio of nitrogen to titanium alloy is varied to achieve a desired work function. For example, in embodiments where the device is to be formed over the p-type conductivity well 102, such as depicted in FIG. 1C, the work function layer 108 may comprise $(Ti_yAl)N_x$, wherein x is less than about 0.46 and may be zero (e.g., $Ti_yAl$), and y may be between about 0.1 to 10, for example 1. Alternatively, in embodiments where the device is to be formed over the n-type conductivity well 104, such as depicted in FIG. 2A, the work function layer 202 may comprise $(Ti_yAl)N_x$, wherein x is greater than about 0.46 and y may be between about 0.1 to 10, for example 1.

The work function layer 108, 202 may be deposited via a deposition process such as chemical vapor deposition (CVD), physical vapor deposition (PVD), or the like. In some embodiments, the work function layer 108, 202 may be deposited via a PVD process in any suitable process chamber, for example, any process chamber having a target comprising a source material to be sputtered on the substrate 100. In embodiments where the work function layer 108, 202 comprises $(Ti_yAl)N_x$, the source material may comprise titanium and aluminum, wherein the compositional ratio of titanium to aluminum may be varied to facilitate a desired work function layer 108, 202 composition. In some embodiments, the compositional ratio of titanium to aluminum may be between about 0.1:1 to about 10:1, or in some embodiments, about 3:1. In The work function layer 108, 202 may be deposited by providing a deposition gas mixture into the process chamber to react with the source material from the target. The reaction causes the target to eject atoms of the source material, which are then directed towards the substrate 100, thus depositing material.

In some embodiments, such as in embodiments where the work function layer 108, 202 comprises $(Ti_yAl)N_x$, the deposition gas mixture may be a nitrogen containing gas, for example, nitrogen ($N_2$). In some embodiments, the nitrogen containing gas may be provided at a flow rate of between about 1 to about 200 sccm. The flow rate of the nitrogen containing gas may be varied to control the reaction between the nitrogen containing gas and the titanium and the source material of the target, thus controlling the composition of nitrogen to the source material in the deposited layer. In some embodiments the deposition gas mixture may also include an inert gas, such as argon (Ar). The inert gas may be provided at a flow rate of between about 0 to about 200 sccm. In some embodiments, the pressure within the process chamber may be maintained at between about 0.5 mTorr to about 200 mTorr.

In some embodiments, a source power may be applied to the target during processing to maintain a plasma formed from the deposition gas mixture. In some embodiments, the source power may comprise a DC power of up to about 5 kW, or in some embodiments, about 0.02 kW. The DC power may be varied throughout the process to facilitate selective deposition of the work function layer 108, 202. Alternatively, in some embodiments, an RF signal may be supplied at a power up to about 10 kW at a frequency of between about 0.2 MHz to about 60 MHz, or in some embodiments, about 100 MHz.

In some embodiments, a DC power and an RF power may be simultaneously applied to the target to facilitate control and promote depositional uniformity throughout the surface of the substrate 100. For example, a DC power and RF power may be simultaneously applied to the target to generate plasma. The DC and RF power may then be continuously and alternately increased with respect to one another to correct a center-high non uniformity in radial distribution and an edge-high non uniformity in radial distribution. Such embodiments and methods of operation are set forth in U.S. patent application Ser. No. 12/188,937, Aug. 8, 08, "Method for Ultra Uniform Sputter Deposition Using Simultaneous RF and DC Power on Target," assigned to the assignee of the present invention, and which is incorporated herein by reference.

In some embodiments, to facilitate selective deposition of the ejected atoms of the target material on the substrate 100, a bias power in the form of RF power may be applied to a substrate support pedestal supporting the substrate 100. In some embodiments, up to about 5 kW of RF power may be supplied at a frequency of between 0.02 to about 100 MHz, or in some embodiments, about 2 MHz. Alternatively, two RF power sources may be utilized, providing a dual frequency substrate bias. Up to about 5 kW of RF power of a first RF bias signal may be provided at a frequency of between about 1 to about 100 MHz. Up to about 5 kW of RF power of a second RF bias signal may be provided at a frequency of between about 0.02 to about 2 MHz.

Figure 1D:
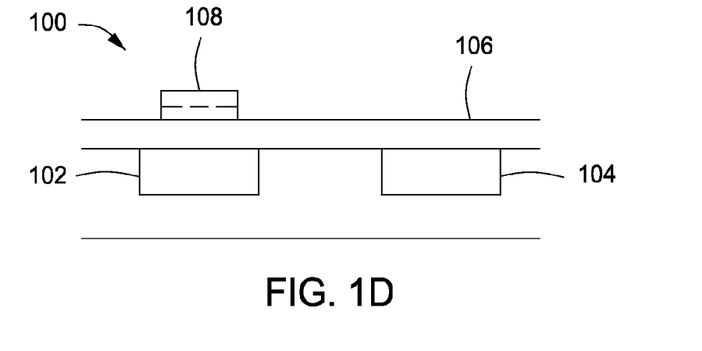
FIG. 1D is an illustrative cross-sectional view of a substrate during a stage of a processing sequence in accordance with some embodiments of the present invention.
Figure 2B:
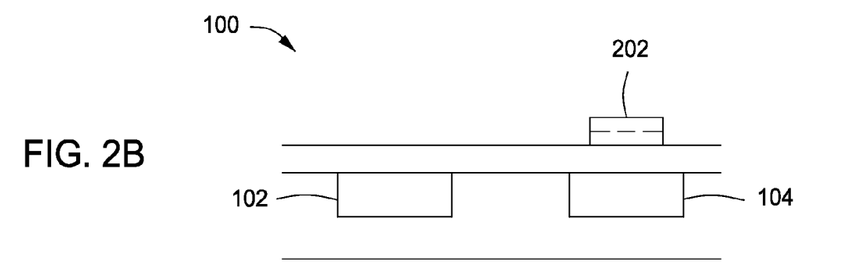
FIG. 2B is an illustrative cross-sectional view of a substrate during a stage of a processing sequence in accordance with some embodiments of the present invention.

Next, at 510, the work function layer 108, 202 is etched to selectively remove a portion of the work function layer 108, 202 from atop the dielectric layer 106, as shown in FIGS. 1D and 2B. In some embodiments, the work function layer 108 is etched to selectively remove a portion of the work function layer 108 from above the p-type conductivity well 102, as depicted in FIG. 1D. In some embodiments, the work function layer 202 is etched to selectively remove a portion of the work function layer from above the n-type conductivity well 104, as depicted in FIG. 2B. In embodiments where one or more optional cap layers are deposited, such as in embodiments described above, the etch process further comprises selectively etching the one or more optional cap layers. In some embodiments, the substrate may be exposed to a process gas comprising at least one of chlorine and argon to facilitate etching the work function layer 108, 202. In some embodiments, a plasma may be formed from the process gas. Ions from the plasma may be directed toward the substrate to etch the work function layer 108, 202. In some embodiments a patterned layer such as a mask layer or anti-reflective coating (ARC) may be deposited atop may be deposited atop the work function layer 108, 202 to create a pattern for selective etching.

Figure 1E:
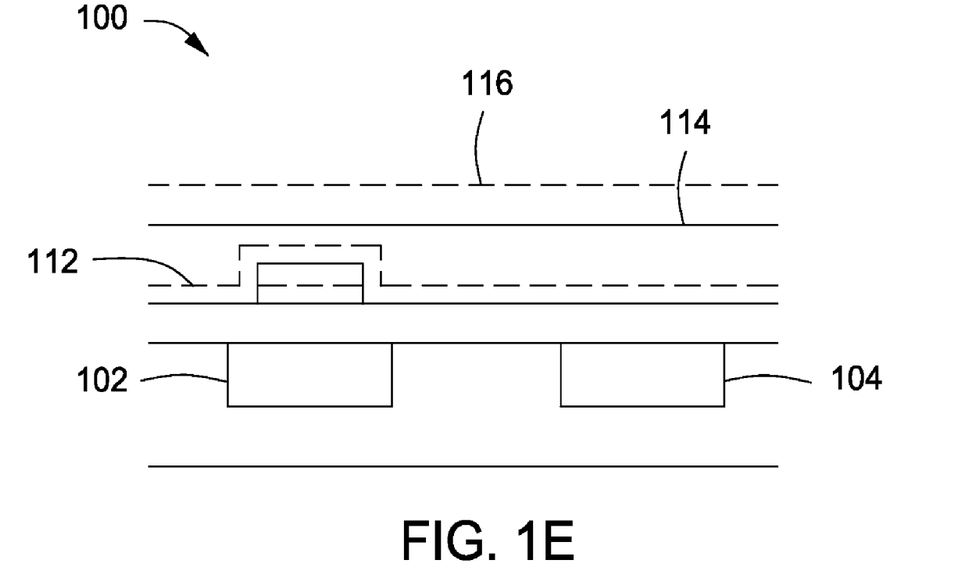
FIG. 1E is an illustrative cross-sectional view of a substrate during a stage of a processing sequence in accordance with some embodiments of the present invention.

In some embodiments, at 512, an optional barrier layer 112 may be deposited atop the etched work function layer 108 and the dielectric layer 106, as shown in FIG. 1E. In some embodiments, the barrier layer 112 may be deposited to a thickness of up to about 20 Å with a thickness uniformity standard of deviation of less than about 2%. In some embodiments, the optional barrier layer may comprise TaN or TiN and have a composition uniformity standard of deviation of less than about 2%. The barrier layer 112 may be deposited via any suitable deposition method capable of depositing the barrier layer to the desired thickness while not causing plasma induced damage to the underlying layers, such as ALD, CVD, PVD, or the like.

Figure 2C:
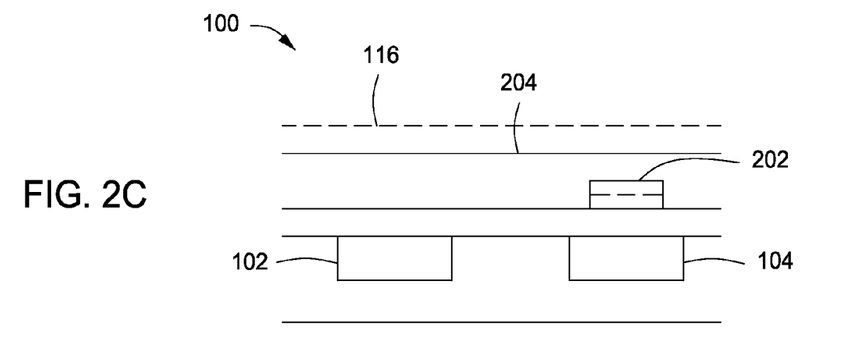
FIG. 2C is an illustrative cross-sectional view of a substrate during a stage of a processing sequence in accordance with some embodiments of the present invention.

Next, at 514, a layer 114, 204 having a second nitrogen composition is deposited atop the work function layer 108, 202, as shown in FIGS. 1E and 2C. In some embodiments, the layer 114, 204 comprises a nitrided titanium alloy, such as nitrides of titanium aluminum (TiAlN), titanium lanthanum (TiLaN), titanium silicon (TiSiN), titanium hafnium (TiHfN), titanium ruthenium (TiRuN), titanium cobalt (TiCoN), or the like. In some embodiments, for example, in such embodiments where the device is formed over the p-type conductivity well 102, such as depicted in FIG. 1E, the layer 114 may comprise $(Ti_yAl)N_x$, wherein x is greater than about 0.46. Alternatively, in some embodiments, for example, in such embodiments where the device is formed over the n-type conductivity well 104, such as depicted in FIG. 2C, the layer 204 may comprise $(Ti_yAl)N_x$, wherein x is less than about 0.46. In some embodiments, the layer 114, 204 may be deposited to a thickness of between about 20 to about 150 Å. The layer 114, 204 may be deposited via the same process as described above with respect to the deposition of the work function layer 108, 202.

In some embodiments, at 516, an optional barrier layer 116 may be deposited atop the layer 114, 204, as shown in FIGS. 1E and 2C. In some embodiments, the barrier layer 116 may comprise TiN. In some embodiments, the barrier layer 116 may be deposited to a thickness of up to 100 Å. The barrier layer 116 may be deposited via any suitable deposition process, such as ALD, PVD, CVD, or the like.

Figure 1F:
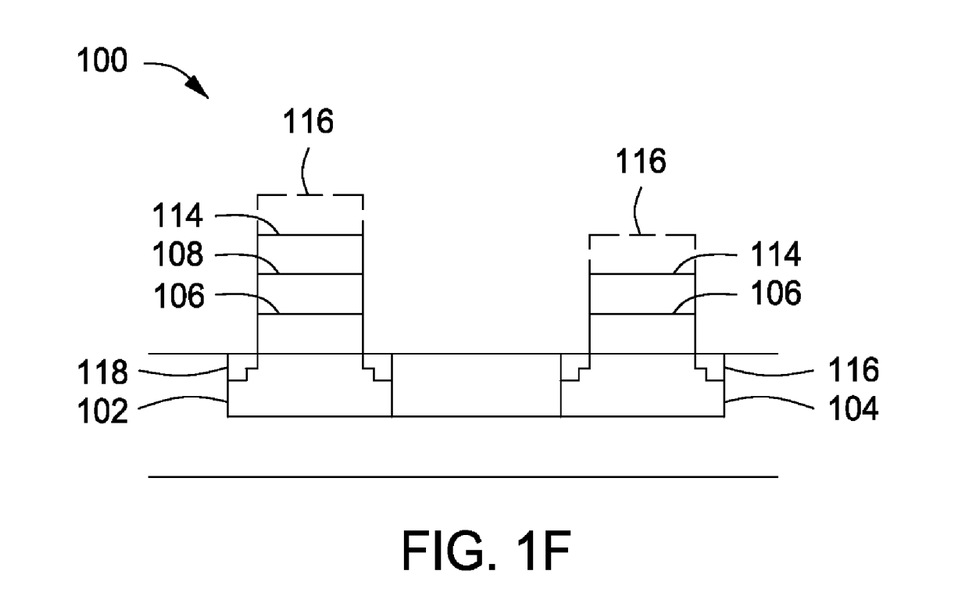
FIG. 1F is an illustrative cross-sectional view of a substrate during a stage of a processing sequence in accordance with some embodiments of the present invention.
Figure 2D:
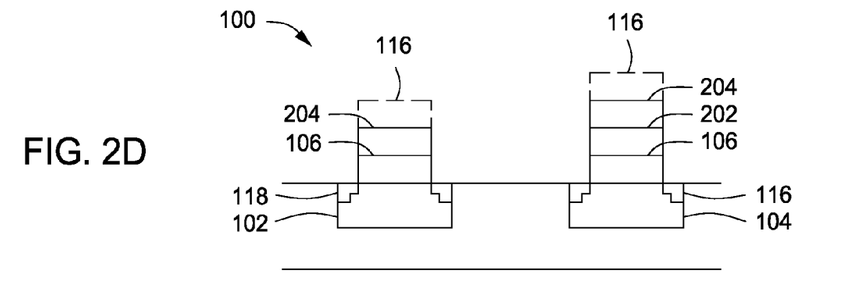
FIG. 2D is an illustrative cross-sectional view of a substrate during a stage of a processing sequence in accordance with some embodiments of the present invention.

Next, at 518, the layer 114, 204 and the dielectric layer 106 may be etched to selectively remove a portion of the layer 114, 204 and the dielectric layer 106 from the surface of the substrate 100, as shown in FIGS. 1F and 2D. In some embodiments, the substrate may be exposed to a process gas suitable for etching the layers 114, 204, 116. For example, the process gas may comprise chlorine (Cl) and argon (Ar) to facilitate etching the layer 114, 204 and the dielectric layer 106. In some embodiments, a plasma may be formed from the process gas. Ions from the plasma may be directed toward the substrate to facilitate the etch. In some embodiments a patterned layer, such as a mask layer or anti-reflective coating (ARC) may be deposited atop the layer 114, 204 and the dielectric layer 106 to create a pattern for selective etching.

Next, at 520, the substrate 100 is annealed. The anneal may be performed in the presence of one or more annealing gases which may be selected from a group including oxygen ($O_2$), ozone ($O_3$), atomic oxygen (O), hydrogen ($H_2$), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), and hydrazine ($N_2H_4$). In some embodiments, the annealing gas includes hydrogen ($H_2$) and oxygen ($O_2$). In some embodiments, the annealing gas may be provided at a flow rate of between about 10 to about 5000 sccm. In some embodiments, the anneal may be performed at temperature greater than about 1000 degrees Celsius and for a duration up to about 30 seconds. In some embodiments, the anneal may be performed in any process chamber suitable for providing the annealing gases and for heating the substrate to the above temperatures.

Upon annealing the substrate 100 at 520, the process 500 generally ends and additional process steps (not shown) may be performed to complete fabrication of the semiconductor device and/or other devices (not shown) on the substrate 100. For example, a conducting layer, such as polysilicon or another suitable conducting material, such as a metal, may be deposited atop the substrate 100. Additional process steps may include ion implantation to form source/drain regions 118, 116 in the substrate 100 adjacent to the p-type conductivity well 102 and n-type conductivity well 104.

Figure 6:
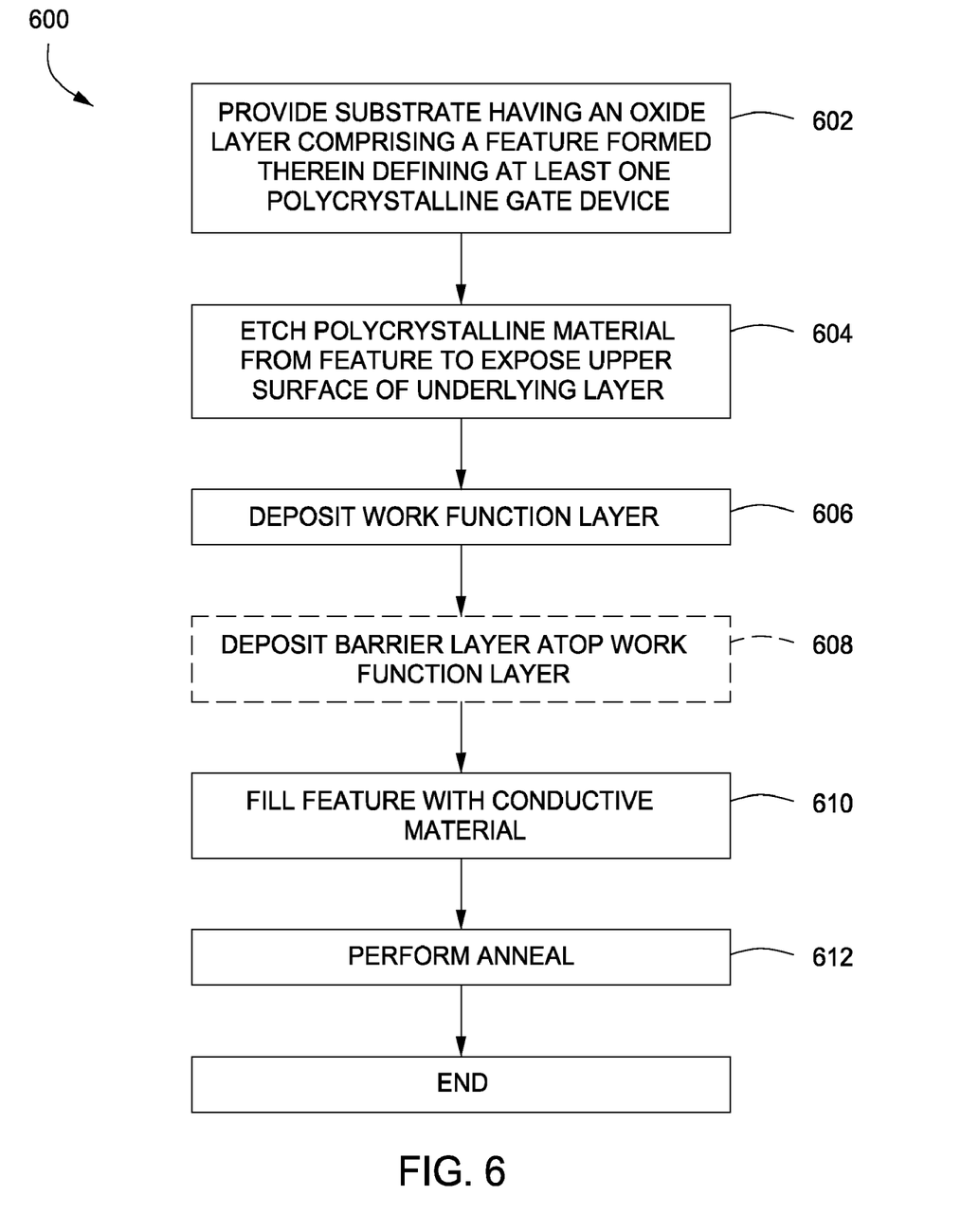
FIGS. 6 depicts a method for processing substrates in accordance with some embodiments of the present invention.

FIG. 6 depicts a method for processing semiconductor substrates in accordance with some embodiments of the present invention. FIG. 3 depicts illustrative cross-sectional views of a substrate during different stages of the method of FIG. 6 with respect to forming a semiconductor device atop a p-type conductivity well 302, in accordance with some embodiments of the present invention. FIG. 4 depicts illustrative cross-sectional views of a substrate during different stages of the method of FIG. 6 with respect to forming a semiconductor device atop an n-type conductivity well 304, in accordance with some embodiments of the present invention. The above method may be performed in any apparatus suitable for processing semiconductor substrates in accordance with embodiments of the present invention, such as discussed below with respect to FIG. 7.

Figure 3A:
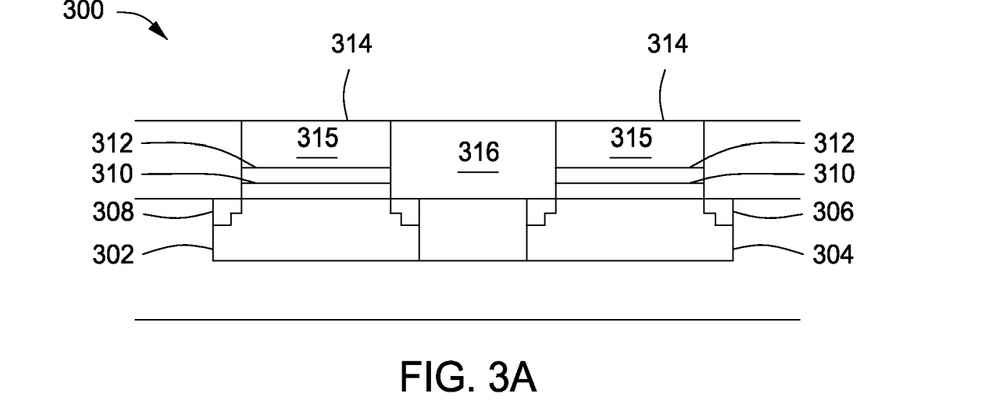
FIG. 3A is an illustrative cross-sectional view of a substrate during a stage of a processing sequence in accordance with some embodiments of the present invention.

The method 600 begins at 602, where a substrate 300 having an oxide layer 316 formed thereon is provided, as depicted in FIG. 3A. The substrate 300 may be any suitable substrate, such as a silicon substrate, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a light emitting diode (LED) substrate, a solar cell array, solar panel, or the like. In some embodiments, the substrate 300 may be a semiconductor wafer (e.g., a 200 mm, 300 mm, or the like silicon wafer), such as a doped or undoped polysilicon wafer, a doped or undoped silicon wafer, a patterned or non-patterned wafer, or the like. In some embodiments, the substrate comprises a p-type conductivity well 302 and/or an n-type conductivity well 304 and respective source/drain regions 308, 306.

In some embodiments, such as where one or more devices are to be formed on the substrate 300, a plurality of field isolation regions (not shown) may be formed in the substrate 300 to isolate conductivity wells having different conductivity types (e.g., n-type or p-type) and/or to isolate adjacent transistors. The field isolation regions may be shallow trench isolation (STI) structures formed, for example, by etching a trench into the substrate 100 and then filling the trench with a suitable insulator, such as silicon oxide (oxide), silicon nitride (nitride), or the like.

The oxide layer 316 comprises at least one feature formed therein defining at least one device 314 formed atop the p-type conductivity well 302 and/or the n-type conductivity well 304 wherein the device 314 comprises a dielectric layer 310 disposed atop a respective conductivity well 302, 304, a barrier layer 312 comprising TaN or TiN disposed atop the dielectric layer 310 and a polycrystalline material 315 disposed atop the barrier layer 312.

In some embodiments the dielectric layer 310 may comprise a high-K material, such as a material having a dielectric constant greater than about 3.9. For example, the high-K dielectric material may be hafnium oxide ($HfO_2$), hafnium silicon oxide ($HfSiO_x$), hafnium silicon oxynitride ($HfSiNO_x$), or the like. In some embodiments, the barrier layer 312 may comprise TaN or TiN and have a thickness of up to about 40Å, or between about 5 to about 20521. In some embodiments, the polycrystalline material 315 may comprise a polycrystalline silicon.

Figure 3B:
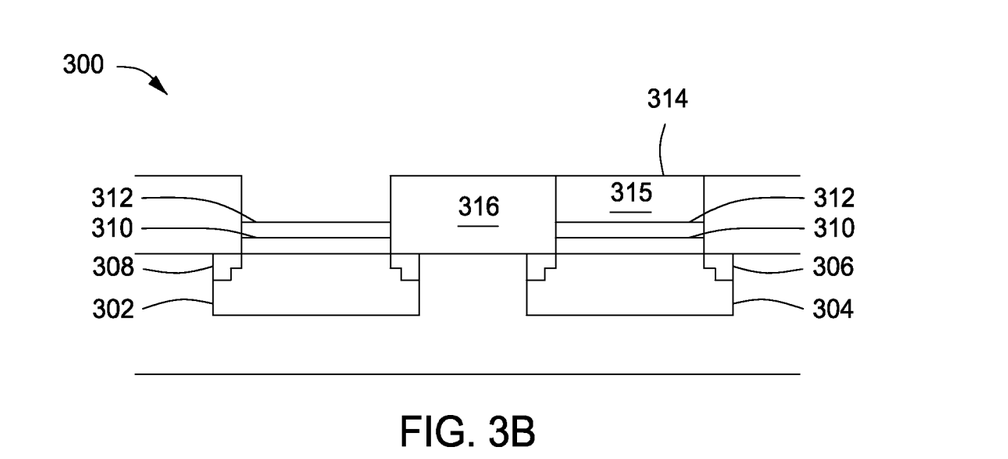
FIG. 3B is an illustrative cross-sectional view of a substrate during a stage of a processing sequence in accordance with some embodiments of the present invention.
Figure 4A:
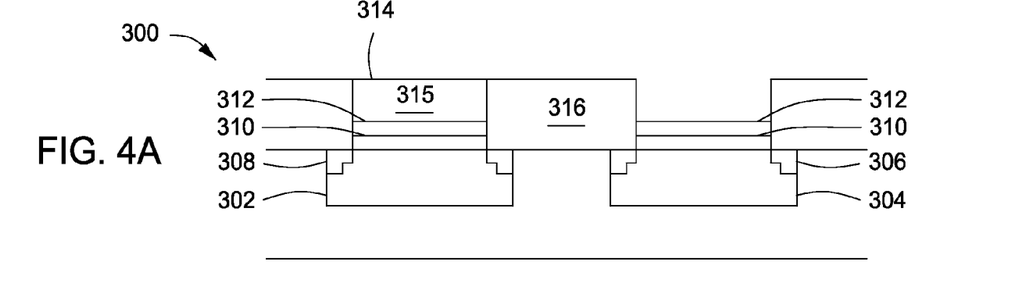
FIG. 4A is an illustrative cross-sectional view of a substrate during a stage of a processing sequence in accordance with some embodiments of the present invention.

The method proceeds to 604, where the polycrystalline material 315 is etched to expose the upper surface of the barrier layer 312, as shown in FIGS. 3B and 4A. In some embodiments, the polycrystalline material 315 may be etched to expose the upper surface of the barrier layer 312 disposed atop the p-type conductivity well 302, as depicted in FIG. 3B. Alternatively, the polycrystalline material 315 may be etched to expose the upper surface of the barrier layer 312 disposed atop the n-type conductivity well 304, as depicted in FIG. 4A.

In some embodiments, the substrate 300 may exposed to a process gas comprising fluorine (F) or chlorine (Cl) to facilitate etching the polycrystalline material 315. In some embodiments, a plasma may be formed from the process gas. Ions from the plasma may be directed toward the substrate to etch the polycrystalline material 315. In some embodiments a patterned layer such as a mask layer or anti-reflective coating (ARC) may be deposited atop the oxide layer 316 to create a pattern for selective etching.

Figure 3C:
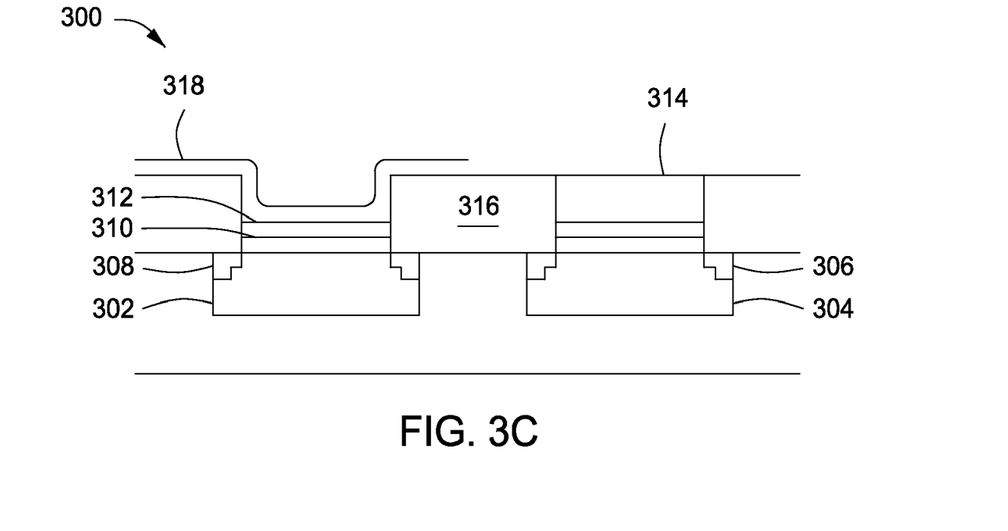
FIG. 3C is an illustrative cross-sectional view of a substrate during a stage of a processing sequence in accordance with some embodiments of the present invention.
Figure 4B:
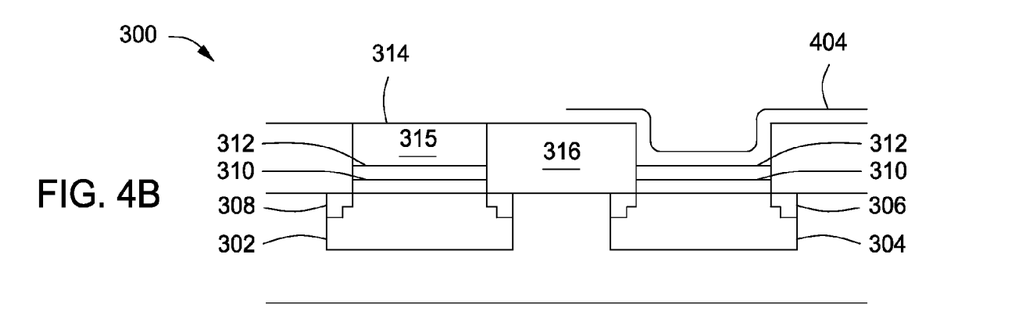
FIG. 4B is an illustrative cross-sectional view of a substrate during a stage of a processing sequence in accordance with some embodiments of the present invention.

Next, at 606, a work function layer 318, 404 is deposited, as shown in FIGS. 3C and 4B. In some embodiments, the work function layer 318, 404 may comprise a nitrided titanium alloy, such as nitrides of titanium aluminum (TiAlN), titanium lanthanum (TiLaN), titanium silicon (TiSiN), titanium hafnium (TiHfN), titanium ruthenium (TiRuN), titanium cobalt (TiCoN), or the like. In such embodiments, the ratio of nitrogen to titanium alloy is varied to achieve a desired work function. For example, in embodiments where the device is formed over the p-type conductivity well 302, such as depicted in FIG. 3C, the work function layer 318 may comprise $(Ti_yAl)N_x$, wherein x is less than about 0.46. Alternatively, in embodiments where the device is formed over the n-type conductivity well 304, such as depicted in FIG. 4B, the work function layer 404 may comprise $(Ti_yAl)N_x$, wherein x is greater than about 0.46. In some embodiments, the work function layer 318, 404 may be deposited to a thickness of between about 10 to about 50 Å.

The work function layer 318, 404 may be deposited via a deposition process such as chemical vapor deposition (CVD), physical vapor deposition (PVD), or the like. In some embodiments, the work function layer 318, 404 may be deposited via a PVD process in any suitable process chamber, for example, any process chamber having a target comprising a source material to be sputtered on the substrate 300. In embodiments where the work function layer 318, 404 comprises $(Ti_yAl)N_x$, the source material may comprise titanium and aluminum, wherein the compositional ratio of titanium to aluminum may be varied to facilitate a desired work function layer composition. The work function layer 318, 404 may be deposited by providing a deposition gas mixture into the process chamber to react with the source material from the target. The reaction causes the target to eject atoms of the source material, which are then directed towards the substrate 300, thus depositing material.

In some embodiments, such as in embodiments where the work function layer 318, 404 comprises $(Ti_yAl)N_x$, the deposition gas mixture may be a nitrogen containing gas, for example, nitrogen ($N_2$). In some embodiments, the nitrogen containing gas may be provided at a flow rate of between about 1 to about 200 sccm. The flow rate of the nitrogen containing gas may be varied to control the reaction between the nitrogen containing gas and the titanium and the source material of the target, thus controlling the composition of nitrogen to the source material in the deposited layer. In some embodiments the deposition gas mixture may also include an inert gas, such as argon (Ar). The inert gas may be provided at a flow rate of between about 0 to about 200 sccm. In some embodiments, the pressure within the process chamber may be maintained at between about 0.5 mTorr to about 100 mTorr.

In some embodiments, a source power may be applied to the target during processing to maintain a plasma formed from the deposition gas mixture. In some embodiments, the source power may comprise a DC power of up to about 2 kW, or in some embodiments, about 0.5 kW. The DC power may be varied throughout the process to facilitate selective deposition of the work function layer 318, 404. Alternatively, in some embodiments, an RF signal may be supplied at a power up to about 10 kW at a frequency of between about 0.2 MHz to about 60 MHz, or in some embodiments, up to about 100 MHz.

In some embodiments, a DC power and an RF power may be simultaneously applied to the target to facilitate control and promote depositional uniformity throughout the surface of the substrate 300. For example, a DC power and RF power may be simultaneously applied to the target to generate a plasma. The DC and RF power may then be continuously and alternately increased with respect to one another to correct a center-high non uniformity in radial distribution and an edge-high non uniformity in radial distribution.

In some embodiments, to facilitate selective deposition of the ejected atoms of the target material on the substrate 100, a bias power in the form of RF power may be applied to a substrate support pedestal supporting the substrate 100. In some embodiments, up to about 5 kW of RF power may be supplied at a frequency of between 0.02 to about 100 MHz, or in some embodiments, about 0.2 MHz. Alternatively, two RF power sources may be utilized, providing a dual frequency substrate bias. Up to about 5 kW of RF power of a first RF bias signal may be provided at a frequency of between about 1 to about 100 MHz. Up to about 5 kW of RF power of a second RF bias signal may be provided at a frequency of between about 0.02 to about 1 MHz.

Figure 3D:
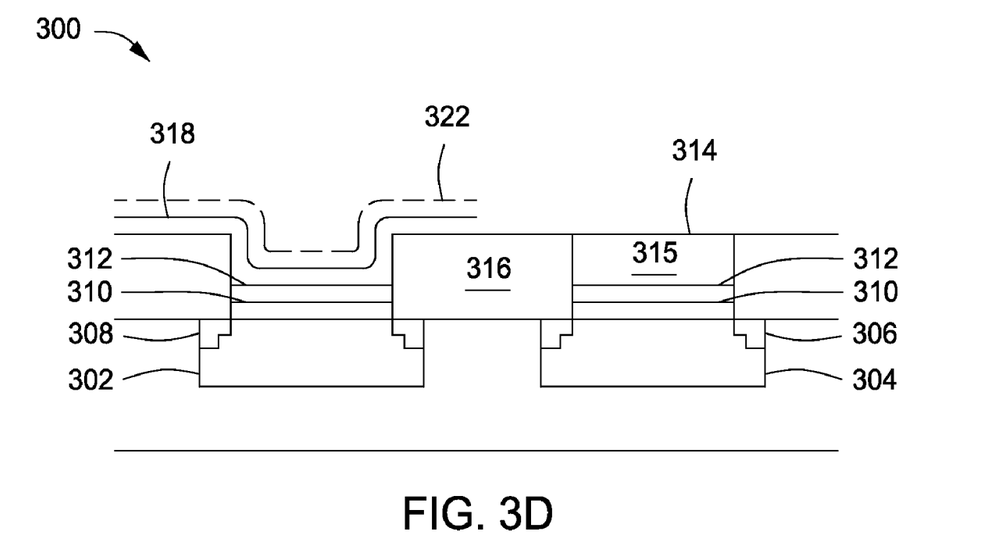
FIG. 3D is an illustrative cross-sectional view of a substrate during a stage of a processing sequence in accordance with some embodiments of the present invention.
Figure 4C:
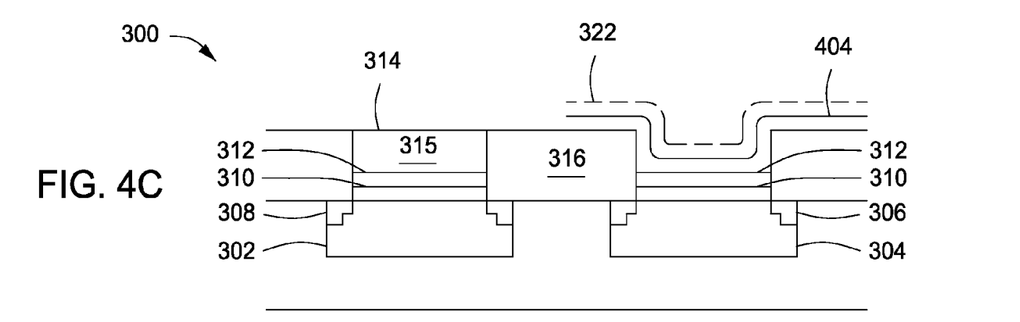
FIG. 4C is an illustrative cross-sectional view of a substrate during a stage of a processing sequence in accordance with some embodiments of the present invention.

In some embodiments, at 608, an optional barrier layer 322 may be deposited atop the work function layer 318, 404, as shown in FIGS. 3D and 4C. In some embodiments, the barrier layer 322 may comprise titanium nitride (TiN). In some embodiments, the barrier layer may be deposited by any suitable deposition process such as ALD, PVD, CVD, or the like to a thickness of up to 100 Å.

Figure 3E:
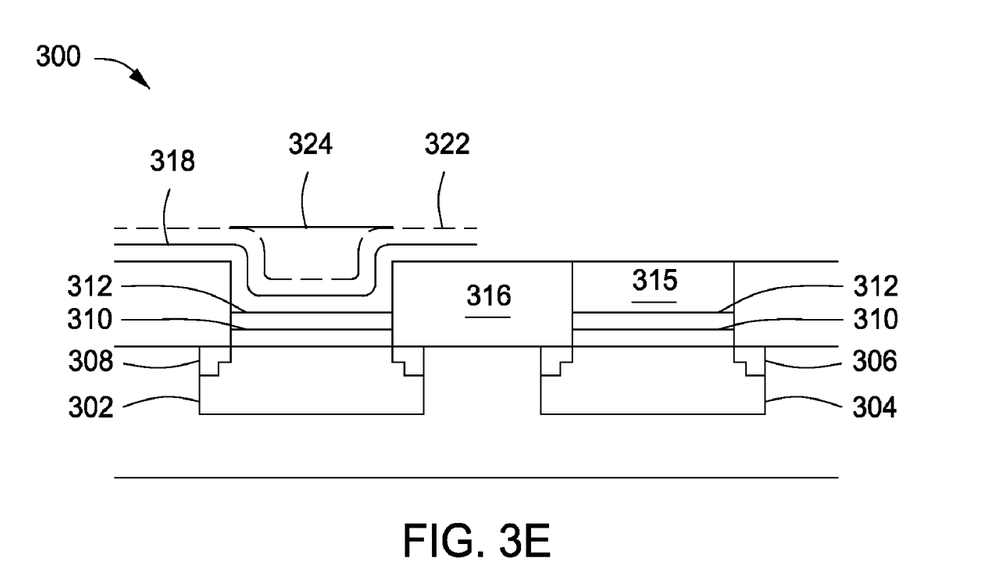
FIG. 3E is an illustrative cross-sectional view of a substrate during a stage of a processing sequence in accordance with some embodiments of the present invention.
Figure 4D:
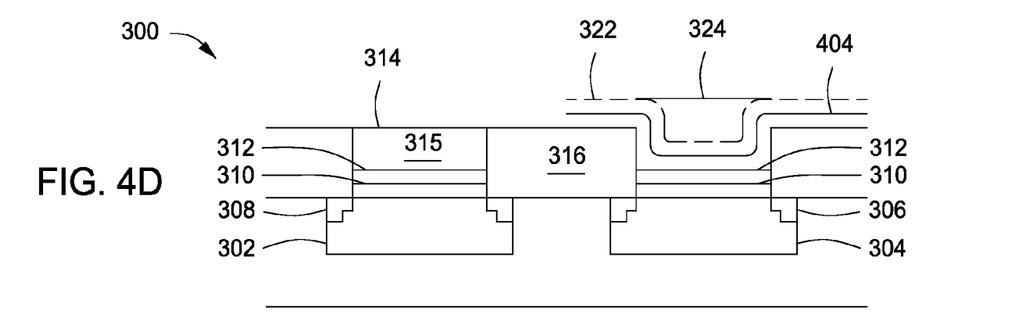
FIG. 4D is an illustrative cross-sectional view of a substrate during a stage of a processing sequence in accordance with some embodiments of the present invention.

Next, at 610, the feature is filled with a conductive material 324, as shown in FIGS. 3E and 4D. The conductive material may comprise any conductive material or alloy, such as aluminum (Al), tungsten (W), copper (Cu), or the like. In some embodiments, the conductive material 324 may be deposited into the feature via an electrochemical plating process.

The method proceeds to 612, where the substrate 300 is annealed. The anneal may be performed in the presence of one or more annealing gases which may be selected from a group including oxygen ($O_2$), ozone ($O_3$), atomic oxygen (O), hydrogen ($H_2$), water ($H_2O$), nitric oxide (NO), nitrous oxide ($N_2O$), nitrogen dioxide ($NO_2$), dinitrogen pentoxide ($N_2O_5$), nitrogen ($N_2$), ammonia ($NH_3$), and hydrazine ($N_2H_4$). In some embodiments, the annealing gas includes hydrogen ($H_2$) and oxygen ($O_2$). In some embodiments, the annealing gas may be provided at a flow rate of up to about 5000 sccm. In some embodiments, the anneal may be performed at temperature of between about 200 to about 400 degrees Celsius and for a duration up to about 600 seconds.

In some embodiments, the substrate 300 is annealed in a forming gas atmosphere comprising a hydrogen containing gas and a nitrogen containing gas. In some embodiments the hydrogen containing gas may be provided at a flow rate of between about 5 to about 5000 sccm and the nitrogen containing gas may be provided at a flow rate of between about 5 to about 5000 sccm. In some embodiments, the anneal may be performed at temperature of between about 200 to about 400 degrees Celsius and for a duration up to about 600 seconds.

Upon annealing the substrate 300 at 520, the process 500 generally ends and additional process steps (not shown) may be performed to complete fabrication of the semiconductor device and/or other devices (not shown) on the substrate 202. For example, a process step to remove excess material from atop the substrate 300, such as a chemical mechanical polish, may be performed.

Figure 7:
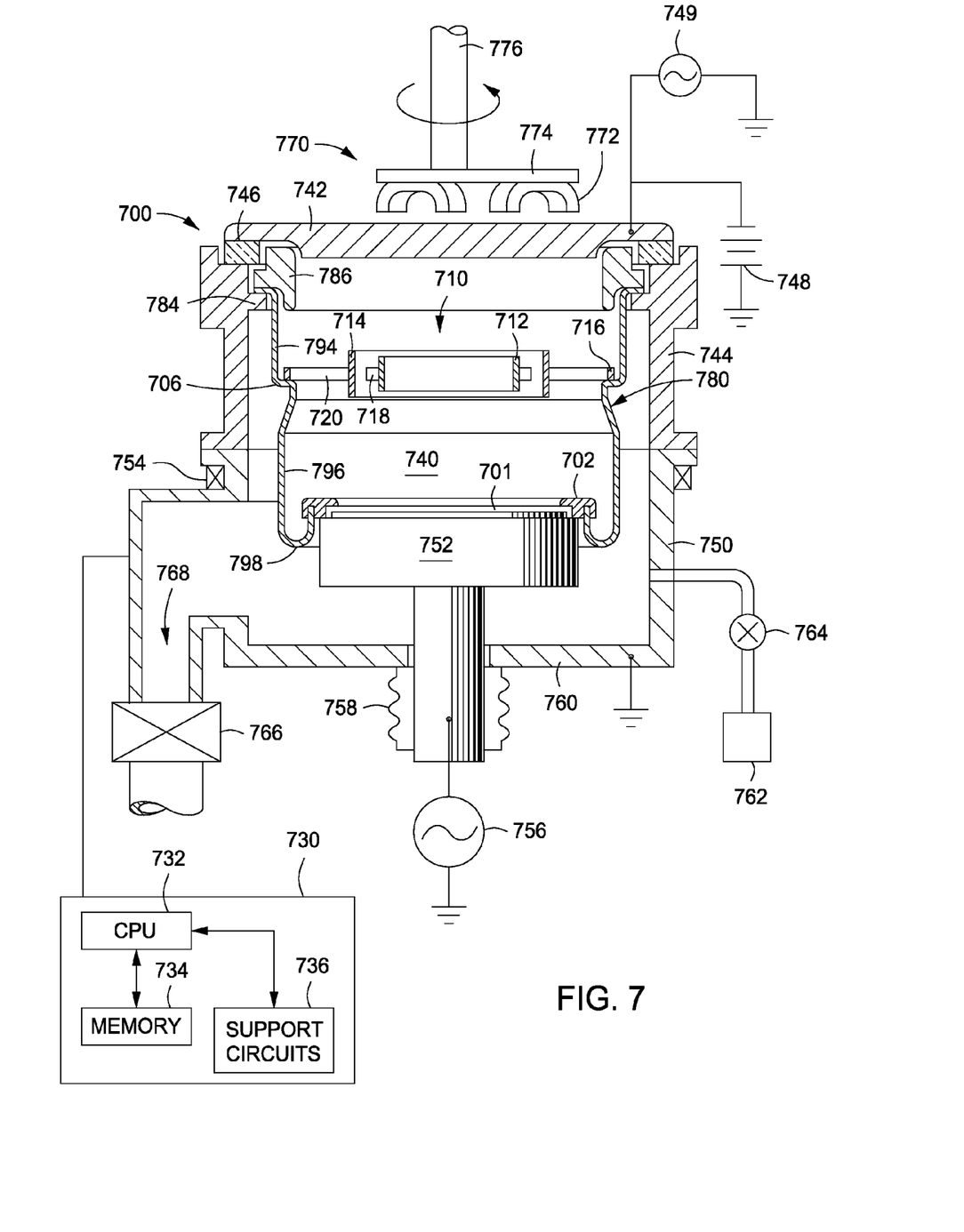
FIG. 7 depicts an apparatus suitable for processing semiconductor substrates in accordance with some embodiments of the present invention.

The inventive methods described herein may be performed in a physical vapor deposition chamber as described below. FIG. 7 illustrates one embodiment of a physical vapor deposition chamber (processing chamber 700) in which the invention may be practiced. Examples of suitable PVD chambers include the ALPS® Plus and SIP ENCORE™ PVD processing chambers, both commercially available from Applied Materials, Inc., of Santa Clara, Calif. It is contemplated that other processing chambers from other manufactures may also be utilized to perform the present invention.

In some embodiments, the processing chamber 700 contains a substrate support pedestal 752 for receiving a substrate 701 thereon, and a sputtering source, such as a target 742. The substrate support pedestal 752 may be located within a grounded enclosure wall 750, which may be a chamber wall (as shown) or a grounded shield (not shown). The substrate support pedestal 752 may include any suitable means (not shown) of providing heat to the substrate 701, for example, such as a resistive heating element, radiant cavity and light source, or the like.

The target 742 may be supported on a grounded conductive aluminum adapter 744 through a dielectric isolator 746. The target 742 comprises a source material to be deposited on the substrate 701 during sputtering, The substrate support pedestal 752 has a material-receiving surface facing the principal surface of the target 742 and supports the substrate 701 to be sputter coated in planar position opposite to the principal surface of the target 742. The substrate support pedestal 752 may support the substrate 701 in a central region 740 of the processing chamber 700. The central region 740 is defined as the region above the substrate support pedestal 752 during processing (for example, between the target 742 and the substrate support pedestal 752 when in a processing position).

The substrate support pedestal 752 is vertically movable through a bellows 758 connected to a bottom chamber wall 760 to allow the substrate 100 to be transferred onto the substrate support pedestal 752 through a load lock valve (not shown) in the lower portion of processing chamber 700 and thereafter raised to a deposition, or processing position as depicted in FIG. 7. One or more processing gases may be supplied from a gas source 762 through a mass flow controller 764 into the lower part of the chamber 700. An exhaust port 768 may be provided and coupled to a pump (not shown) via a valve 766 for exhausting the interior of the processing chamber 700 and facilitating maintaining a desired pressure inside the processing chamber 700.

A controllable DC power source 748 may be coupled to the chamber 200 to apply a negative voltage, or bias, to the target 742. An RF power supply 756 may be coupled to the substrate support pedestal 752 in order to induce a negative DC bias on the substrate 100. In addition, in some embodiments, a negative DC self-bias may form on the substrate 701 during processing. In other applications, the substrate support pedestal 752 may be grounded or left electrically floating.

In some embodiments, an RF power supply 749 may also be coupled to the chamber 700 to apply RF power to the target 742 to facilitate control of the radial distribution of a deposition rate on substrate 701.

A rotatable magnetron 770 may be positioned proximate a back surface of the target 742. The magnetron 770 includes a plurality of magnets 772 supported by a base plate 774. The base plate 774 connects to a rotation shaft 776 coincident with the central axis of the chamber 700 and the substrate 100. The magnets 772 produce a magnetic field within the chamber 700, generally parallel and close to the surface of the target 742 to trap electrons and increase the local plasma density, which in turn increases the sputtering rate. The magnets 772 produce an electromagnetic field around the top of the chamber 700, and magnets 772 are rotated to rotate the electromagnetic field which influences the plasma density of the process to more uniformly sputter the target 742.

The chamber 700 further includes a grounded bottom shield 780 connected to a ledge 784 of the adapter 744. A dark space shield 786 is supported on the bottom shield 780 and is fastened to the shield 780 by screws or other suitable manner. The metallic threaded connection between the bottom shield 780 and the dark space shield 786 allows the two shields 780, 786 to be grounded to the adapter 744. The adapter 744 in turn is sealed and grounded to the aluminum chamber sidewall 750. Both shields 780, 786 are typically formed from hard, non-magnetic stainless steel.

In some embodiments, a gas conductance ring (not shown) may be positioned proximate the support pedestal 752 to direct gas flow from the gas source 762 to the top of the chamber 700 and then downwards towards the support pedestal 752 to facilitate an even distribution of gas across the substrate 701.

The bottom shield 780 extends downwardly in an upper tubular portion 794 of a first diameter and a lower tubular portion 796 of a second diameter. The bottom shield 780 extends along the walls of the adapter 744 and the chamber wall 750 downwardly to below a top surface of the substrate support pedestal 752 and returns upwardly until reaching a top surface of the substrate support pedestal 752 (e.g., forming a u-shaped portion 798 at the bottom). A cover ring 702 rests on the top of the upwardly extending inner portion 700 of the bottom shield 780 when the substrate support pedestal 752 is in its lower, loading position but rests on the outer periphery of the substrate support pedestal 752 when it is in its upper, deposition position to protect the substrate support pedestal 752 from sputter deposition. An additional deposition ring (not shown) may be used to shield the periphery of the substrate 100 from deposition.

The chamber 700 may also be adapted to provide a more directional sputtering of material onto a substrate. In one embodiment, directional sputtering may be achieved by positioning a collimator 710 between the target 742 and the substrate support pedestal 752 to provide a more uniform and symmetrical flux of deposition material to the substrate 100.

The collimator 710 may rest on the ledge portion of the bottom shield 780, thereby grounding the collimator 710. The collimator 710 may be a metal ring and may include an outer tubular section and at least one inner concentric tubular section, for example, three concentric tubular sections 712, 714, 716 linked by cross struts 720, 718. The outer tubular section 716 rests on the ledge portion 706 of the bottom shield 780. The use of the bottom shield 780 to support the collimator 710 simplifies the design and maintenance of the chamber 700. At least the two inner tubular sections 712, 714 are of sufficient height to define high aspect ratio apertures that partially collimate the sputtered particles. Further, the upper surface of the collimator 710 acts as a ground plane in opposition to the biased target 742, which facilitates keeping plasma electrons away from the substrate 701.

In some embodiments, a magnet 754 may be disposed about the chamber 700 for selectively providing a magnetic field between the substrate support pedestal 752 and the target 742. For example, as shown in FIG. 7, the magnet 754 may be disposed about the outside of the chamber wall 750 in a region just above the substrate support pedestal 752 when in processing position. The magnet 754 may be an electromagnet and may be coupled to a power source (not shown) for controlling the magnitude of the magnetic field generated by the electromagnet. In some embodiments, the magnet 754 may include a plurality of inner magnetic coils (not shown) and a plurality of outer magnetic coils (not shown) arranged about the chamber 700. The number of individual coils in the plurality of inner magnetic coils and the plurality of outer magnetic coils may be selected as desired to provide a magnetic field having a desired strength.

The type and configuration of the magnet 754 or the plurality of inner magnetic coils and the plurality of outer magnetic coils may be varied in different processing chambers 700 or for different applications. The strength of the magnetic field formed by the magnet 754 or the plurality of inner magnetic coils and the plurality of outer magnetic coils may also be varied as desired for a particular application. For example, in some non-limiting embodiments, the plurality of inner magnetic coils and the plurality of outer magnetic coils may each receive a positive or negative current of between 0 to about 25 Amps to form the magnetic field. In some embodiments, the respective currents applied to the plurality of inner magnetic coils and the plurality of outer magnetic coils may have a difference between absolute values of magnitudes of less than or equal to about 3 Amps. It is contemplated that other values may be utilized as the hardware configuration permits.

A controller 730 is coupled to various components of the process chamber 700 for controlling the operation thereof and comprises a central processing unit (CPU) 732, a memory 734, and support circuits 736 for the CPU 732. The controller 730 may control the substrate processing apparatus directly, or via computers (or controllers) associated with particular process chamber and/or the support system components. The controller 730 may be one of any form of general-purpose computer processor that can be used in an industrial setting for controlling various chambers and sub-processors. The memory, or computer-readable medium, 734 of the CPU 732 may be one or more of readily available memory such as random access memory (RAM), read only memory (ROM), floppy disk, hard disk, flash, or any other form of digital storage, local or remote. The support circuits 736 are coupled to the CPU 732 for supporting the processor in a conventional manner. These circuits include cache, power supplies, clock circuits, input/output circuitry and subsystems, and the like. Inventive methods as described herein may be stored in the memory 734 as software routine that may be executed or invoked to control the operation of the process chamber 700 in the manner described herein. The software routine may also be stored and/or executed by a second CPU (not shown) that is remotely located from the hardware being controlled by the CPU 732.

While the foregoing is directed to embodiments of the present invention, other and further embodiments of the invention may be devised without departing from the basic scope thereof, and the scope thereof is determined by the claims that follow.

The invention claimed is:

1. A method of forming a device on a substrate, comprising:
    depositing a dielectric layer atop a substrate having a conductivity well;
    depositing a work function layer comprising titanium aluminum or titanium aluminum nitride having a first nitrogen composition atop the dielectric layer;
    etching the work function layer to selectively remove a portion of the work function layer from atop the dielectric layer to expose portions of the dielectric layer;
    depositing a layer comprising titanium aluminum or titanium aluminum nitride having a second nitrogen composition atop the etched work function layer and the exposed portions of the dielectric layer, wherein at least one of the work function layer or the layer comprises nitrogen;
    etching the layer and the dielectric layer to selectively remove a portion of the layer and the dielectric layer from atop the substrate; and
    annealing the substrate at a temperature less than about 1500 degrees Celsius.

2. The method of claim 1, wherein depositing the dielectric layer comprises:
    depositing a first layer comprising $SiO_2$; and
    depositing a second layer comprising a dielectric material having a dielectric constant greater than about 3.9.

3. The method of claim 2, wherein the dielectric material comprises hafnium oxide, hafnium silicon oxide, or hafnium silicon oxynitride.

4. The method of claim 1, further comprising:
    depositing a barrier layer comprising tantalum nitride atop the dielectric layer prior to depositing the work function layer.

5. The method of claim 1, further comprising:
    depositing a cap layer comprising lanthanum, lanthanum oxide, aluminum, or aluminum oxide prior to depositing the work function layer.

6. The method of claim 1, further comprising:
    depositing a barrier layer comprising tantalum nitride (TaN) or titanium nitride (TiN) atop the work function layer prior to depositing the layer comprising titanium aluminum nitride.

7. The method of claim 1, wherein the first nitrogen composition is less than about 0.46, including zero, and the second nitrogen composition is greater than about 0.46, and wherein a ratio of titanium to aluminum in the work function layer and in the layer is between about 0.1 to about 10.

8. The method of claim 1, wherein the first nitrogen composition is greater than about 0.46 and the second nitrogen composition is less than about 0.46, including zero, and wherein a ratio of titanium to aluminum in the work function layer and in the layer is between about 0.1 to about 10.

9. The method of claim 1, wherein the work function layer is deposited via a physical vapor deposition process.

10. The method of claim 9, wherein the physical vapor deposition process comprises:
provinding the substrate to a process chamber having a target comprising a source material to be deposited on the substrate;
applying an RF source power and a DC source power to the target to form a plasma from a process gas; and
sputtering the source material from the target to deposit the source material on the substrate;
wherein the RF source power and the DC source power are adjusted relative to one another during sputtering to control a uniformity of the source material deposited on the substrate.

11. A method of forming a device on a substrate, comprising:
providing a substrate comprising a conductivity well and an oxide layer formed thereon, wherein the oxide layer comprises at least one feature formed therein defining at least one polycrystalline gate device formed atop the conductivity well and wherein the polycrystalline gate device comprises a first layer of dielectric material disposed atop the conductivity well, a second layer comprising tantalum nitride (TaN) or titanium nitride (TiN) disposed atop the dielectric material and a polycrystalline material disposed atop the second layer;
etching the polycrystalline material to expose an upper surface of the second layer;
depositing a work function layer atop the second layer, wherein the work function layer comprises titanium aluminum or titanium aluminum nitride;
filling the feature with a conductive material; and
annealing the substrate to form the device.

12. The method of claim 11, further comprising:
depositing a barrier layer comprising titanium nitride, titanium aluminum, or titanium aluminum nitride atop the work function layer prior to filling the feature with the conductive metal.

13. The method of claim 11, wherein the work function layer is deposited via a physical vapor deposition process.

14. The method of claim 13, wherein the physical vapor deposition process comprises:
providing the substrate to a process chamber having a target comprising a source material to be deposited on the substrate;
applying an RF source power and a DC source power to the target to form a plasma from a process gas;
sputtering the source material from the target to deposit the source material on the substrate.

15. The method of claim 14, wherein the physical vapor deposition process further comprises:
adjusting the RF source power and the DC source power relative to one another during sputtering to control a uniformity of the source material deposited on the substrate.

16. The method of claim 11, wherein the work function layer comprises $(Ti_yAl)N_x$, wherein x is less than about 0.46, including zero, and y is between about 0.1 to about 10.

17. The method of claim 11, wherein the work function layer comprises $(Ti_yAl)N_x$, wherein x is greater than about 0.46 and y is between about 0.1 to about 10.

* * * * *

UNITED STATES PATENT AND TRADEMARK OFFICE
CERTIFICATE OF CORRECTION

PATENT NO.        : 8,129,280 B2  
APPLICATION NO.   : 12/508820  
DATED             : March 6, 2012  
INVENTOR(S)       : Wang et al.

Page 1 of 1

It is certified that error appears in the above-identified patent and that said Letters Patent is hereby corrected as shown below:

In column 9, line 12, delete "20521" and substitute therefor --20Å--.

Signed and Sealed this  
First Day of May, 2012

David J. Kappos  
*Director of the United States Patent and Trademark Office*